United States Patent [19]

Takatori et al.

[11] Patent Number: 5,151,790
[45] Date of Patent: Sep. 29, 1992

[54] IMAGE PICKUP DEVICE FOR STABILIZING OPTICAL ABERRATIONS

[75] Inventors: Naoki Takatori; Masaaki Orimoto, both of Tokyo, Japan

[73] Assignee: Fuji Photo Film Co., Ltd., Kanagawa, Japan

[21] Appl. No.: 726,054

[22] Filed: Jul. 5, 1991

[30] Foreign Application Priority Data

Jul. 23, 1990 [JP] Japan ................................. 2-194131

[51] Int. Cl.⁵ ..................... H04N 5/225; G02B 13/16
[52] U.S. Cl. .................................. 358/225; 358/209; 359/619
[58] Field of Search ................ 358/225, 209, 213.11, 358/227; 359/885, 888, 619, 625, 626, 558, 564

[56] References Cited

U.S. PATENT DOCUMENTS

| | | | |
|---|---|---|---|
| 4,804,249 | 2/1989 | Reynolds et al. | 359/558 |
| 4,805,028 | 2/1989 | Nishioka et al. | 358/225 |
| 4,998,801 | 3/1991 | Shiraishi et al. | 359/885 |
| 5,029,010 | 7/1991 | Shiraishi | 358/225 |

Primary Examiner—Michael Razavi
Assistant Examiner—Wendy R. Greening
Attorney, Agent, or Firm—Sughrue, Mion, Zinn, Macpeak & Seas

[57] ABSTRACT

An image pickup device for use in a general image pickup input apparatus such as a video camera, an electronic camera and the like to prevent generation of a false signal or moires. The image pickup device includes an optical filter interposed between a taking lens and an image pickup element. Due to this, the image of an object light is formed by the taking lens at a given image forming position, and a spot image at the image forming position enters the optical filter as a divergent light in a given circle and is then guided through the optical filter to the image pickup element. This can remove space frequency components corresponding to the pixel pitch of the image pickup element and prevent the optical aberrations from being unstabilized.

6 Claims, 5 Drawing Sheets

IMAGE PICKUP DEVICE FOR STABILIZING OPTICAL ABERRATIONS

BACKGROUND OF THE INVENTION

1. Field of the Invention

The present invention relates to an image pickup device for use in general image pickup input apparatus such as a video camera, an electronic still camera and the like, and, in particular, to an image pickup device which is capable of preventing generation of false signals and moires.

2. Description of the Related Art

In general, a taking lens for use in a video camera and the like is a singlet (single lens) which is designed in consideration of balancing various aberrations with each other.

However, when such taking lens is incorporated into a video camera or the like, due to the fact that, in most cases, in front of a CCD image pickup device (which is hereinafter referred to as a CCD) there is arranged an optical filter or the like to remove space frequency components corresponding to the pixel pitches of the CCD, an optical aberration tends to be unstable, resulting in the deteriorated optical performance.

SUMMARY OF THE INVENTION

The present invention aims at eliminating the drawbacks found in the above-mentioned prior art devices.

Accordingly, it is an object of the invention to provide an image pickup device which is capable of optically removing space frequency components corresponding to the pixel pitches of image pickup elements without deteriorating the optical performance of a taking lens.

In order to attain the above problem, according to the invention, there is provided an image pickup device which comprises an image pickup element including a plurality of photo-electric converter elements arranged at a constant pitch, a taking lens for allowing the image of an object light to be formed at a given position in front of the image pickup element, and an optical filter interposed between the object light image forming position and the image pickup element for receiving a spot image at the above image forming position by a divergent light of a given circle to guide the divergent light to the plurality of photo-electric converter elements.

According to the invention, the object light image is formed at a given image forming position by the taking lens, and the spot image at such image forming position is allowed to enter the optical filter as the divergent light of a given circle and is then guided through the optical filter to the plurality of photo-electric converter elements.

Due to the above, space frequency components corresponding to the pixel pitches of the image pickup element can be removed, and also due to the fact that the optical filter is disposed in the rear of the image forming position, there is eliminated the possibility that the optical aberrations become unstable.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DESCRIPTION OF THE PREFERRED EMBODIMENTS

Detailed description will hereunder be given of the preferred embodiments of an image pickup device according to the present invention with reference to the accompanying drawings.

Figure 1:
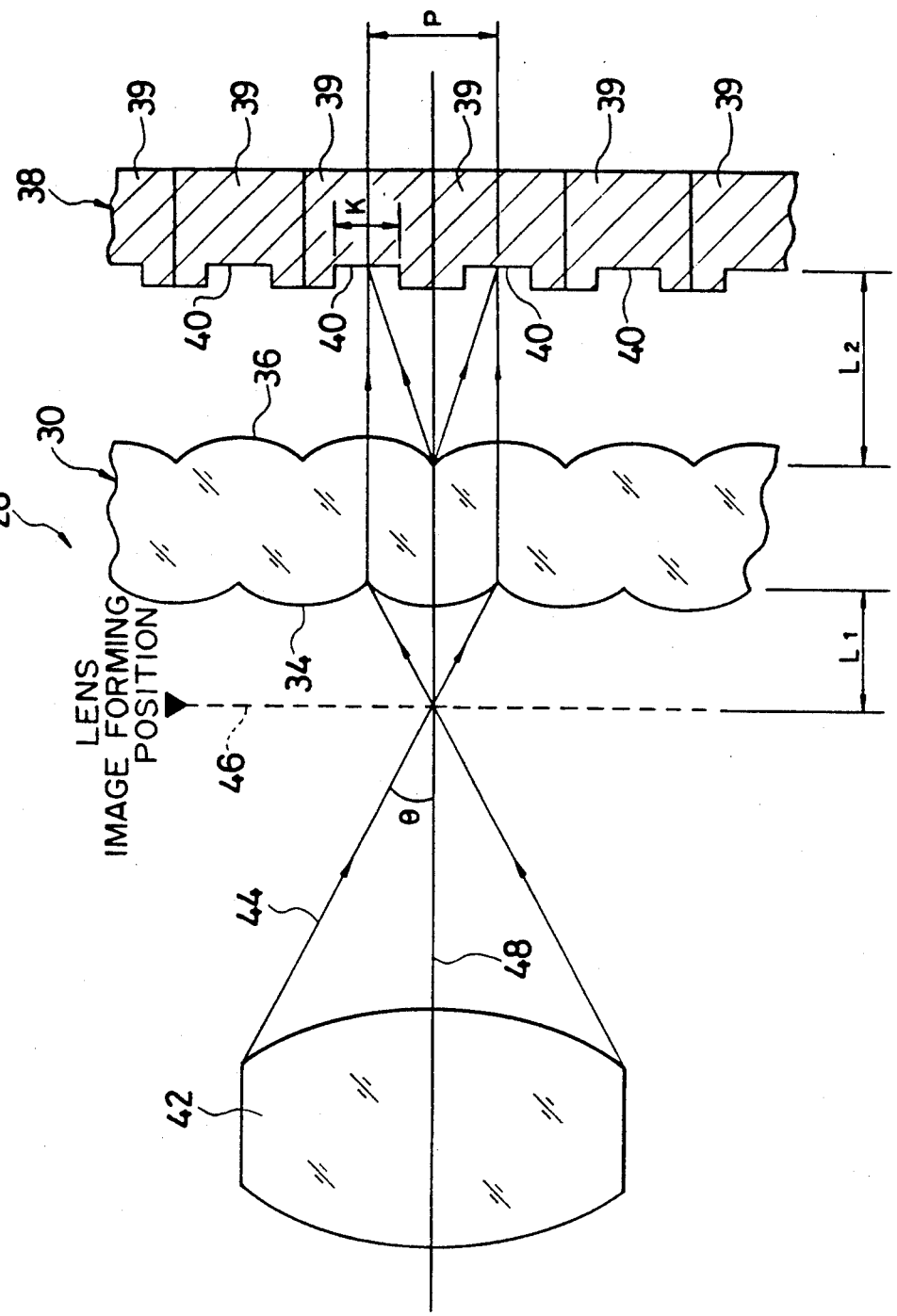
FIG. 1 is a section view of a first embodiment of an image pickup/device according to the invention.

Referring first to FIG. 1, there is shown a first embodiment of an image pickup device constructed in accordance with the present invention. As shown in FIG. 1, the image pickup device 28 includes an optical filter 30, a CCD 38, and a taking lens 42. The optical filter 30 includes in the light entering surface thereof a first micro lens array 34 which consists of a plurality of convex lenses and it also includes in the light leaving surface thereof a second micro lens array 36 consisting of a plurality of convex lenses. The convex lenses of the first micro lens array 34 are in phase with and are shifted by a half pitch from the convex lenses of the second micro lens array 36, respectively.

Also, the pitch of the convex lenses of the second micro lens array 36 is set to be the same as the pixel pitch P of the CCD 38 which is located on the right of the optical filter 30 in FIG. 1. The CCD 38 is composed of a plurality of photo-electric conversion elements 39, 39—which are arranged at a given pixel pitch P from one another.

Therefore, the respective convex lenses of the second micro lens array 36 are arranged such that the respective optical axes thereof are disposed in the respective centers of the light sensing parts 40, 40—of the photo-electric conversion elements 39, 39—.

Further, the taking lens 42 is disposed on the left of the optical filter 30 in FIG. 1. The taking lens 42 is formed such that it allows the image of an object light 44 to be formed at a given lens image forming position 46. By means of this, the object light 44 is once image formed at the lens image forming position 46 and is then allowed to enter the convex lens of the first micro lens array 34 as a diverging light. In this case, the diverging light entering the convex lens is set so that it provides a circle having the same diameter as the above-mentioned pixel pitch P.

Then, the thus entering light is refracted by the convex lenses of the first micro lens array 34 and is thus turned out to be a light which is parallel to an optical axis 48, and the parallel light is divided into two parts which are then sent to the two convex lenses of the second micro lens array 36 respectively. The respective divided lights are condensed through the respective convex lenses onto the two light sensing parts 40, 40.

As mentioned above, the image of the object light 44 is once formed at the lens image forming position 46

(primary image forming) and is further formed again through the optical filter 30 in the light sensing parts 40, 40 (secondary image forming), so that the optical aberrations can be stabilized. Further, due to the fact that the object light 44 is refracted by the convex lens of the first micro lens array 34 so as to be parallel to the optical axis 48, the optical filter 30 can enjoy a freedom in thickness, which is advantageous in manufacturing the optical filter 30.

Also, the object light 44 is divided in two and sent to the two light sensing parts 40, 40 and the divided lights are condensed to the light sensing parts 40, 40, respectively. For this reason, the frequencies corresponding to the pixel pitch P can be attenuated, that is, they can be reduced in intensity and at the same time the light sensitivity can be enhanced.

Figure 2:
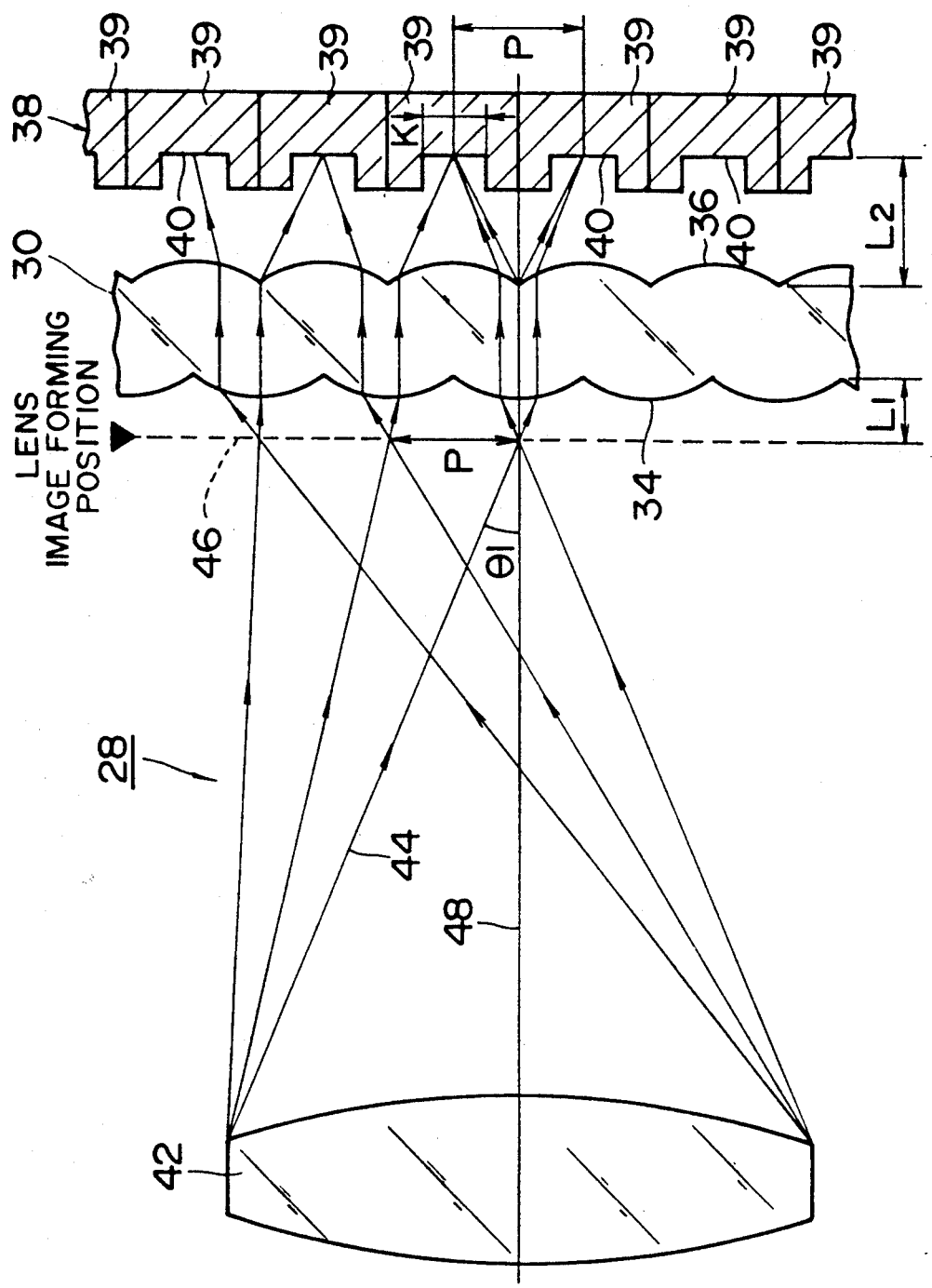
FIG. 2 is a section view of the first embodiment of an image pickup device according to the invention, illustrating a state in which the light leaving angle of a taking lens shown in FIG. 1 is stopped down from $\theta$ to $\theta 1$.

In the first embodiment of the image pickup device 28 constructed in the above-mentioned manner, for the optical filter 30, taking lens 42 and CCD 38, the following equation holds from FIG. 1 and FIG. 2.

In FIG. 2, there is shown a state in which the taking lens 42 shown in FIG. 1 is stopped down to reduce the light leaving angle. That is, an equation, $\theta > \theta_1$ holds n this state.

For the stop diaphragm $F_{n0}$ of the taking lens 42 and the leaving angle $\theta$ of the object light 44, as shown in FIG. 1 and FIG. 2, the following equation holds:

$$\sin \theta = \frac{1}{2 F_{no}} \quad (1)$$

Also, in order that the object light 44 formed in the lens image forming position 46 at the leaving angle of $\theta$ can enter the convex lens of the first micro lens array 34 spaced apart by a distance $L_1$ in a beam corresponding to having a size equal to or less than that of the pixel pitch P, the following equation is necessary $$L_1 \leq \frac{P}{2 \tan \theta} \quad (2)$$

In other words, FIG. 1 shows a construction of the image pickup device 28 for which the equality sign of equation (2) holds, and FIG. 2 shows a construction thereof for which the inequality sign of equation (2) holds by stopping down the taking lens 42 to thereby reduce the value of $\theta$.

Also, in the radius of curvature $r_1$ of the convex lens of the first micro lens array 34 and the distance $L_1$, the following equation holds:

$$r_1 = (n-1)L_1 \quad (3)$$

where n expresses the refractive index of the optical filter.

Further, in order that an image having the same size as P in the lens forming position 46 can be formed as an image having the same size as K in the light sensing part 40 to enhance the light sensitivity, the following equation of magnification must be obtained:

$$\frac{r_1}{r_2} = \frac{P}{K} = \frac{L_1}{L_2} \quad (4)$$

Also, due to the fact that the convex lens of the second micro lens array 36 condenses the incident light onto the light sensing parts 40, 40 of the CCD 38 spaced apart by the distance $L_2$, the following equation holds between the radius of curvature $r_2$ of the convex lens of the second micro lens array 36 and the distance $L_2$:

$$L_2 = \frac{r_2}{n-1} \quad (5)$$

The following are the examples of the numerical values that satisfy the above-mentioned equations (1) through (5):

$F_{n0} = 2.8$
$n = 1.5$
$P = 0.01$ mm
$k = 0.004$ mm
$r_1 = 55$ μm
$r_2 = 22$ μm
$L_1 = 27.5$ μm
$L_2 = 44$ μm

Figure 3:
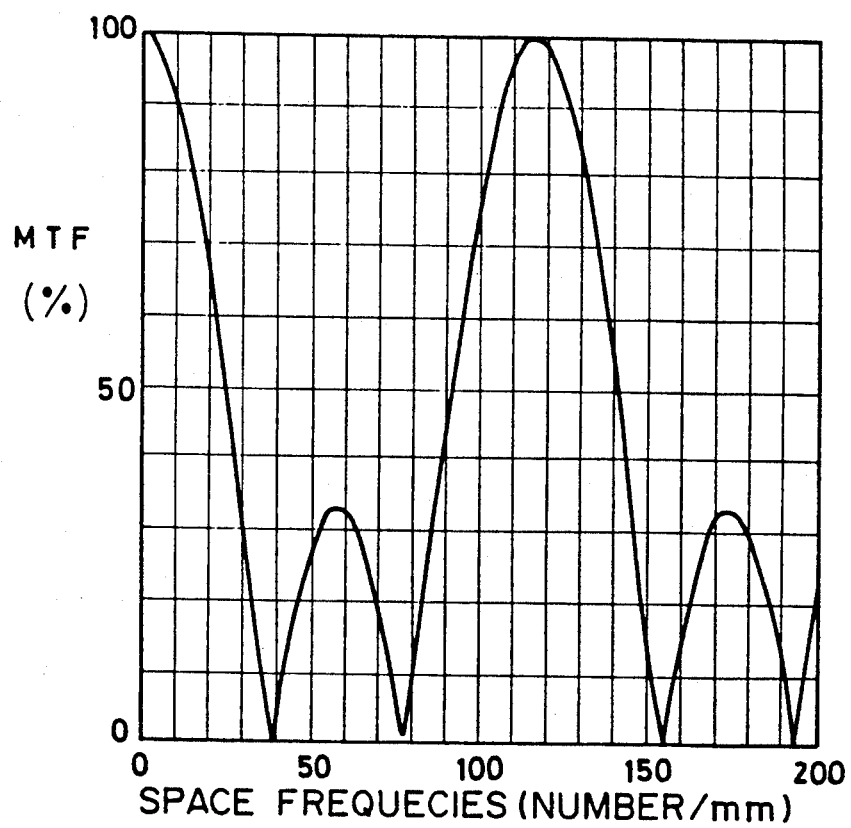
FIG. 3 is a graphical representation of the MTF characteristic of the above-mentioned first embodiment; and, FIGS. 4 and 5 are section views of second and third embodiments of an image pickup device according to the invention.

Referring here to FIG. 3, there is shown the MTF (Modulation Transfer Function) of the optical filter 30 employed in the image pickup device 28, that is, the first embodiment of the invention.

Figure 4:
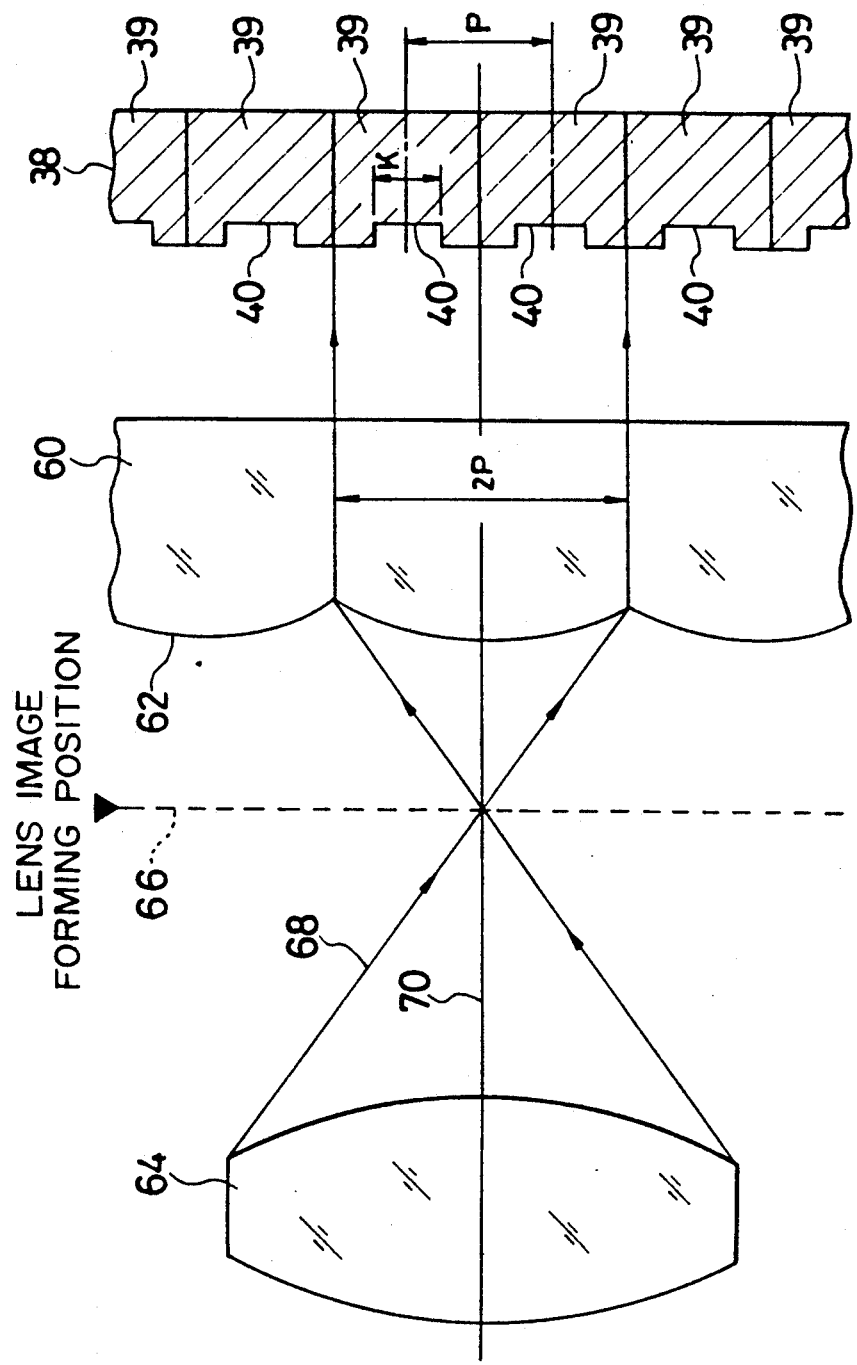

Now, referring to FIG. 4, there is shown a second embodiment of an image pickup device according to the present invention. The two embodiments are different from each other in the optical filters employed. That is, the optical filters employed in the first and second embodiments are different in two points: namely, one difference is that a plurality of convex lenses are formed at twice the pitch of the pixel pitch P in the first micro lens array 62 of the light incident surface of the optical filter 60; and, the other difference is that the second micro lens array is not formed on the light leaving surface of the optical filter 60, that is, the light leaving surface is formed as a flat surface.

In the image pickup device including the optical filter 60 constructed in this manner, an object light 68, that is, the image thereof is first formed through a taking lens 64 at a given lens image forming position 66. The thus image formed object light 68 is then allowed to enter the convex lens of a first micro lens array 62 as a divergent light providing a circle having a diameter twice the pixel pitch P. The divergent light that has entered the convex lens is then refracted by the convex lens of the first micro lens array 62 and is turned out to be a parallel light parallel to an optical axis 70, and the parallel light is then guided to the respective light sensing parts 40, 40 of the two photo-electric conversion elements 39, 39 of the CCD 38.

As mentioned above, due to the fact that the object light 68 is once image formed at the lens image forming position 66 and is then guided to the light sensing parts 40, 40, the optical aberrations can be stabilized.

Further, because the object light 68 is refracted by the convex lens of the first micro lens array 62 to turn out into the parallel light parallel to the optical axis 70, the optical filter can enjoy a freedom in thickness, which is advantageous in manufacturing the same.

Figure 5:
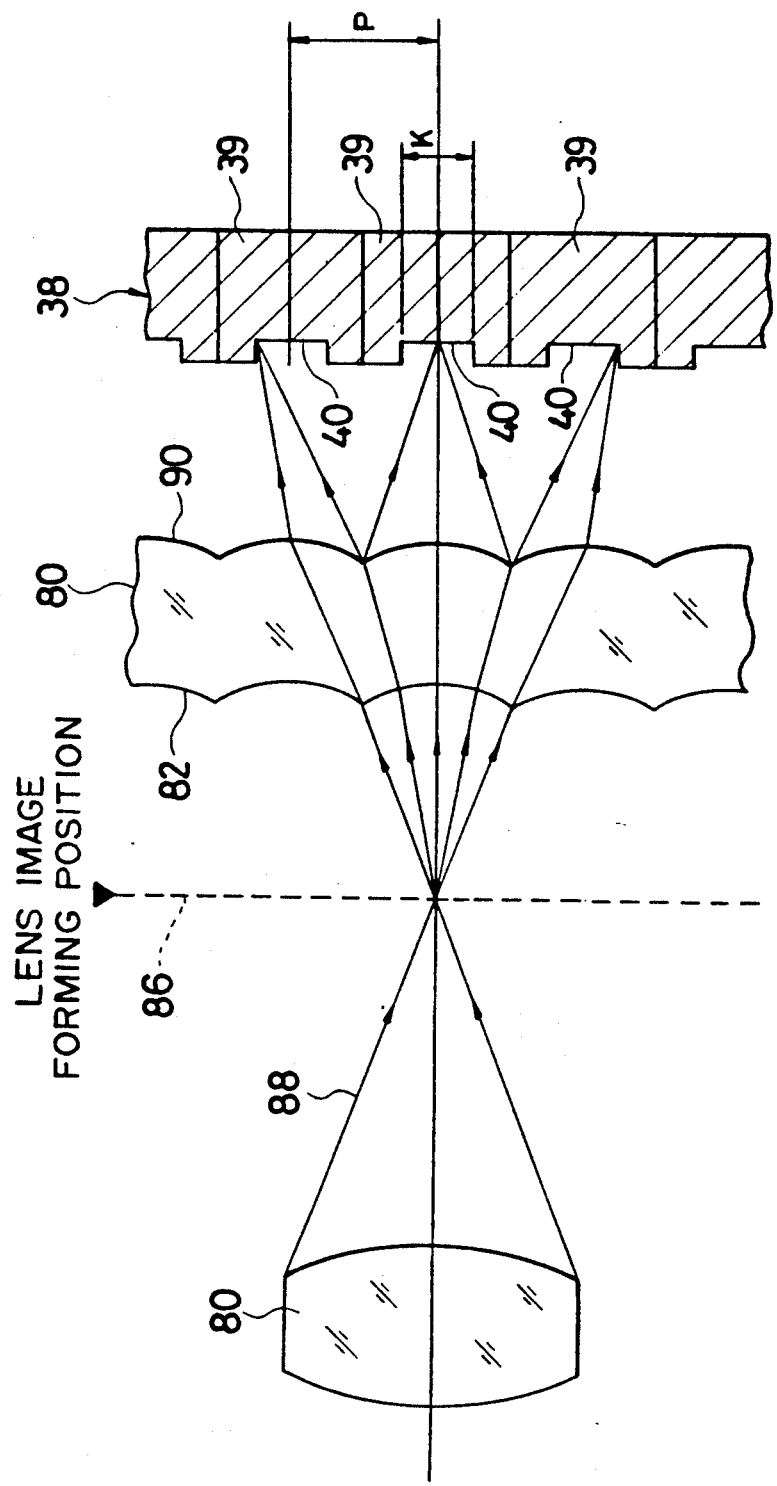

Referring now to FIG. 5, there is shown a third embodiment of an image pickup device according to the present invention. The third embodiment is different from the first embodiment in the optical filter thereof; that is, the optical filter employed in the third embodiment is different from that of the first embodiment in that the optical filter 80 includes in the light entering surface thereof a first lens array 82 consisting of a plurality of concave lenses. In the thus constructed optical filter 80, an object light 88, the image of which is formed at a given lens image forming position 86 through a taking lens 84, is allowed to enter the concave lens of the first micro lens array 82 as a divergent light in a circle having a diameter as large as the pixel pitch P.

Then, the thus entered divergent light is diverged by the convex lens of the first micro lens array 82 and is branched out to the three convex lenses of a second micro lens array 90 formed on the light leaving surface of the optical filter 80. The branched lights are condensed through the respective convex lenses onto the light sensing parts 40, 40, 40 of three photo-electric conversion elements 39, 39, 39.

As described above, according to the third embodiment of the image pickup device of the invention, due to the fact that the object light 88 is once image formed at the lens image forming position 86 and is further image formed through the optical filter 80 in the light sensing parts 40, 40, the optical aberrations can be stabilized. Also, because the object light is branched out and is also condensed to the three light sensing parts 40, 40 and 40, frequency components corresponding to the pixel pitch P can be attenuated to prevent generation of a false signal and also the light sensitivity can be enhanced.

Although in the illustrated first to third embodiments of an image pickup device according to the invention the optical filter includes micro lens arrays in the surface thereof, the invention is not limited to this, but a similar effect can also be obtained by using an optical filter of a refractive index distributive type in which the refractive index thereof is changed by use of chemicals.

As has been described heretofore, according to the image pickup device of the invention, due to the fact that the divergent light, the image of which is formed by the taking lens, is guided through the optical filter to the plurality of light sensing parts, the optical aberrations of the taking lens can be stabilized and thus the space frequency components corresponding to the pixel pitch of the image pickup element can be removed optically without deteriorating the optical performance of the image pickup device.

Also, according to the present invention, due to the fact that the object light is refracted by the optical filter to be parallel to the optical axis, the optical filter according to the invention can enjoy a freedom in thickness, which provides an advantage in manufacturing the optical filter.

It should be understood, however, that there is no intention to limit the invention to the specific forms disclosed, but on the contrary, the invention is to cover all modifications, alternate constructions and equivalents falling within the spirit and scope of the invention as expressed in the appended claims.

We claim:

1. An image pickup device comprising:
    an image pickup element including a plurality of photoelectric conversion elements each having a light receiving portion, wherein said light receiving portions of said photo-electric conversion elements are positioned at a constant pitch relative to said light receiving portions of adjacent photo-electric conversion elements;
    a taking lens positioned in front of an image forming position for allowing an image of an object to be formed at said image forming position, said position being located in front of said image pickup element; and,
    an optical filter interposed between said image forming position and said image pickup element for receiving a spot image formed by light diverging from said image forming position, to guide said diverging light to said plurality of photo-electric conversion elements.

2. An image pickup device as set forth in claim 1, wherein said optical filer includes, on the side thereof facing said image pickup element, a plurality of condensing lenses for condensing said divergent light guided to said photo-electric conversion elements onto the light receiving portion of said photo-electric conversion elements respectively, each of said condensing lenses being formed to correspond to 1 pitch of each of said photo-electric conversion elements.

3. An image pickup device as set forth in claim 2, wherein each of said plurality of condensing lenses of said optical filter includes an optical axis situated at a center of a respective light receiving portion of one of said plurality of photo-electric conversion elements.

4. An image pickup device as set forth in claim 2, wherein said optical filter includes, on the side thereof facing said taking lens, a plurality of condensing lenses formed integral therewith, said plurality of condensing lenses being in phase with said plurality of condensing lenses facing said image pickup element and being shifted by a half pitch from said plurality of condensing lenses facing said image pickup element.

5. An image pickup device as set forth in claim 2, wherein said optical filter includes, on the side thereof facing said taking lens, a plurality of diffusing lenses, said plurality of diffusing lenses being in phase and having the same pitch with said plurality of condensing lenses facing said image pickup element.

6. An image pickup device as set forth in claim 1, wherein said optical filter includes a flat surface on the side thereof facing said image pickup element and, on the side thereof facing said taking lens, includes a plurality of condensing lenses, each of said plurality of condensing lenses having a lateral dimension twice the length of said pitch of said light receiving portions of said photo-electric conversion elements and being capable of condensing divergent light so as to turn said divergent light into light parallel to an optical axis situated at the center of each of said plurality of condensing lenses.

* * * * *